(12) United States Patent
Bacigalupo et al.

(10) Patent No.: US 12,355,462 B2
(45) Date of Patent: Jul. 8, 2025

(54) GATE DRIVER CIRCUIT FOR SAMPLING WITHOUT A TRIGGERING POINT

(71) Applicant: Infineon Technologies AG, Neubiberg (DE)

(72) Inventors: Tommaso Bacigalupo, Fuerstenfeldbruck (DE); Marco Bachhuber, Neuried (DE); Michael Krug, Munich (DE)

(73) Assignee: Infineon Technologies AG, Neubiberg (DE)

( * ) Notice: Subject to any disclaimer, the term of this patent is extended or adjusted under 35 U.S.C. 154(b) by 251 days.

(21) Appl. No.: 18/311,026

(22) Filed: May 2, 2023

(65) Prior Publication Data

US 2024/0372559 A1 Nov. 7, 2024

(51) Int. Cl.
*H03M 1/10* (2006.01)
*H03K 17/041* (2006.01)
(Continued)

(52) U.S. Cl.
CPC ...... *H03M 1/125* (2013.01); *H03K 17/04106* (2013.01); *H03K 17/063* (2013.01)

(58) Field of Classification Search
CPC ............ H03M 1/12; H03M 1/00; H03M 1/06; H03M 1/1004; H03M 1/1009; H03M 1/1042; H03M 1/124; H03K 17/567; H03K 2217/0072; H03K 17/0828; H03K 17/14; H03K 17/162; H03K 17/165; H03K 17/168; H03K 17/687; H03K 17/689; H03K 2017/0806; H03K 2217/0027; H03K 2217/0063; G01K 2219/00; G01K 7/01; G01K 7/16; G01R 31/007; G01R 31/31701; G06F 13/00; G06F 13/28; G06F 2213/28; G06F 3/0604; G06F 3/0655; G06F 3/0679; H02P 27/08; H02P 29/68
(Continued)

(56) References Cited

U.S. PATENT DOCUMENTS 9,705,485 B1 * 7/2017 Finfter ..................... H03K 7/08
9,837,902 B2 * 12/2017 Takeya .................. H02M 3/157
(Continued)

OTHER PUBLICATIONS

U.S. Appl. No. 18/311,052, filed May 2, 2023, naming inventors Bacigalupo et al.
(Continued)

*Primary Examiner* — Linh V Nguyen
(74) *Attorney, Agent, or Firm* — Shumaker & Sieffert, P.A.

(57) ABSTRACT

A gate driver circuit includes one or more datastores configured to store one or more result registers, timer circuitry configured to generate a timing signal, and logic circuitry. The logic circuitry is configured to drive switching circuitry using a switching signal and determine a triggering point of a first cycle of the switching signal. In response to the determination of the triggering point, the logic circuitry is configured to control, using the switching signal, one or more analog-to-digital converters (ADCs) to store a first data sample at the one or more result registers. In response to a determination that the switching signal does not include a triggering point, the logic circuitry is configured to control, using the timing signal, the one or more ADCs to store a second data sample at the one or more result registers.

20 Claims, 9 Drawing Sheets

(51) Int. Cl.
*H03K 17/06* (2006.01)
*H03M 1/12* (2006.01)

(58) Field of Classification Search
USPC .......................................... 341/110, 142, 155
See application file for complete search history.

(56) References Cited

U.S. PATENT DOCUMENTS

| | | | |
|---|---|---|---|
| 10,511,291 B1* | 12/2019 | Kandah | H03K 17/567 |
| 10,892,769 B2* | 1/2021 | Wiktor | H03K 5/06 |
| 2013/0088264 A1* | 4/2013 | Barrenscheen | H03K 17/689 |
| | | | 327/108 |
| 2015/0263724 A1* | 9/2015 | Kreuter | H03K 17/165 |
| | | | 327/434 |
| 2019/0089171 A1 | 3/2019 | Fischer et al. | |
| 2019/0138437 A1 | 5/2019 | Bennett et al. | |
| 2021/0028701 A1* | 1/2021 | Dharmalinggam | H03K 7/08 |
| 2021/0117133 A1 | 4/2021 | Jayasena et al. | |
| 2021/0119627 A1* | 4/2021 | Lee | H02M 7/53871 |
| 2022/0038110 A1 | 2/2022 | Bales | |
| 2022/0182052 A1* | 6/2022 | Heckroth | H02P 27/08 |
| 2023/0006667 A1* | 1/2023 | D'Angelo | H03K 17/18 |
| 2023/0114414 A1 | 4/2023 | SeyedzadehDelcheh et al. | |
| 2023/0129042 A1* | 4/2023 | G | H03M 1/12 |
| | | | 711/154 |

OTHER PUBLICATIONS

"UCC5871-Q1 30-A Isolated IGBT/SiC MOSFET Gate Driver with Advanced Protection Features for Automotive Applications", Texas Instruments, Apr. 2001, 116 pp.

* cited by examiner

GATE DRIVER CIRCUIT FOR SAMPLING WITHOUT A TRIGGERING POINT

TECHNICAL FIELD

This disclosure relates to device communication, for example, communication for a gate driver.

BACKGROUND

A circuit may be configured to cause analog-to-digital converters (ADCs) to store data to the result register. For example, a circuit may store data generated by the ADC to a result register for each cycle of a periodic signal. In this way, the data generated by the ADC at different cycles can be retrieved from the result register.

SUMMARY

The disclosure describes techniques, devices, and systems for communication, for example, communication for a gate driver. For example, rather than stopping all monitoring of a system when a switching signal stops, techniques described herein may continue monitoring using timing circuitry. For example, when a switching signal no longer includes a triggering point, a system may control analog-to-digital converters (ADCs) using a timing signal output by timing circuitry. For instance, when an automobile stops, a system may cause the ADCs to continue to sample measurements, such as, for example, a temperature or battery voltage. In this way, the system may generate more data samples than systems that rely only on triggering points of a switching signal, which may improve an accuracy of a state of a system monitored using the data samples.

In some examples, techniques described herein may generate a readout counter value for data stored by a result register. For example, a system may modify a readout counter value from 0 to 1 in response to storing data to the result register. In this example, the system may set the readout counter value to 0 in response to a read request. In this way, a device reading the data stored to the result register may determine whether the data is valid using the readout counter value, which may be less of a computational burden compared to systems relying only on a comparison of time stamps of data retrieved from the result register.

In some examples, a gate driver circuit includes one or more datastores that includes one or more result registers configured to store data, timer circuitry configured to generate a timing signal, and logic circuitry coupled to the one or more datastores. The logic circuitry is configured to drive switching circuitry using a switching signal and determine a triggering point of a first cycle of a plurality of cycles of the switching signal. In response to the determination of the triggering point, the logic circuitry is configured to control, using the switching signal, one or more ADCs to store a first data sample (e.g., a conversion result) at the one or more result registers. In response to a determination that a set of one or more cycles of the plurality of cycles of the switching signal does not include a triggering point, the logic circuitry is configured to control, using the timing signal, the one or more ADCs to store a second data sample at the one or more result registers In some examples, a method includes driving switching circuitry using a switching signal and determining a triggering point of a first cycle of a plurality of cycles of the switching signal. The method further includes, in response to determining the triggering point, controlling, using the switching signal, one or more ADCs to store a first data sample at one or more result registers of one or more datastores and, in response to determining that a set of one or more cycles of the plurality of cycles of the switching signal does not include a triggering point, controlling, using the timing signal, the one or more ADCs to store a second data sample at the one or more result registers.

In some examples, a system includes one or more ADCs and a gate driver circuit. The gate driver circuit includes one or more datastores configured to store one or more result registers, timer circuitry configured to generate a timing signal, and logic circuitry coupled to the one or more datastores. The logic circuitry is configured to drive switching circuitry using a switching signal and determine a triggering point of a first cycle of a plurality of cycles of the switching signal. In response to the determination of the triggering point, the logic circuitry is configured to control, using the switching signal, the one or more ADCs to store a first data sample at the one or more result registers. In response to a determination that a set of one or more cycles of the plurality of cycles of the switching signal does not include a triggering point, the logic circuitry is configured to control, using the timing signal, the one or more ADCs to store a second data sample at the one or more result registers.

In some examples, a circuit includes one or more datastores configured to store a result register and a readout counter value and logic circuitry coupled to the one or more datastores. The logic circuitry is configured to cause, for a cycle of a plurality of cycles of a periodic signal, one or more ADCs to store data to the result register and modify the readout counter value in response to the one or more ADCs storing the data to the result register for the cycle. In response to a read request for the data at the result register for the cycle, the logic circuitry is configured to output the data stored by the result register, output the readout counter value for the cycle, and, after the output of the readout counter value, set the readout counter value to a predetermined value.

In some examples, a method includes causing, for a cycle of a plurality of cycles of a periodic signal, one or more ADCs to store data to a result register and modifying the readout counter value in response to the one or more ADCs storing the data to the result register for the cycle. The method further includes, in response to a read request for the data at the result register for the cycle, outputting the data stored by the result register, outputting the readout counter value for the cycle, and, after the output of the readout counter value, set the readout counter value to a predetermined value.

In some examples, a system includes a controller circuit configured to output a periodic signal and a driver circuit. The driver circuit includes one or more datastores configured to store a result register and a readout counter value and includes logic circuitry coupled to the one or more datastores. The logic circuitry being configured to cause, for a cycle of a plurality of cycles of the periodic signal, one or more ADCs to store data to the result register and modify the readout counter value in response to the one or more ADCs storing the data to the result register for the cycle. In response to a read request for the data at the result register for the cycle, output the data stored by the result register, the logic circuitry is configured to output the readout counter value for the cycle, and, after the output of the readout counter value, set the readout counter value to a predetermined value.

The details of one or more examples are set forth in the accompanying drawings and the description below. Other features, objects, and advantages of the disclosure will be apparent from the description and drawings, and from the claims.

DETAILED DESCRIPTION

Figure 1:
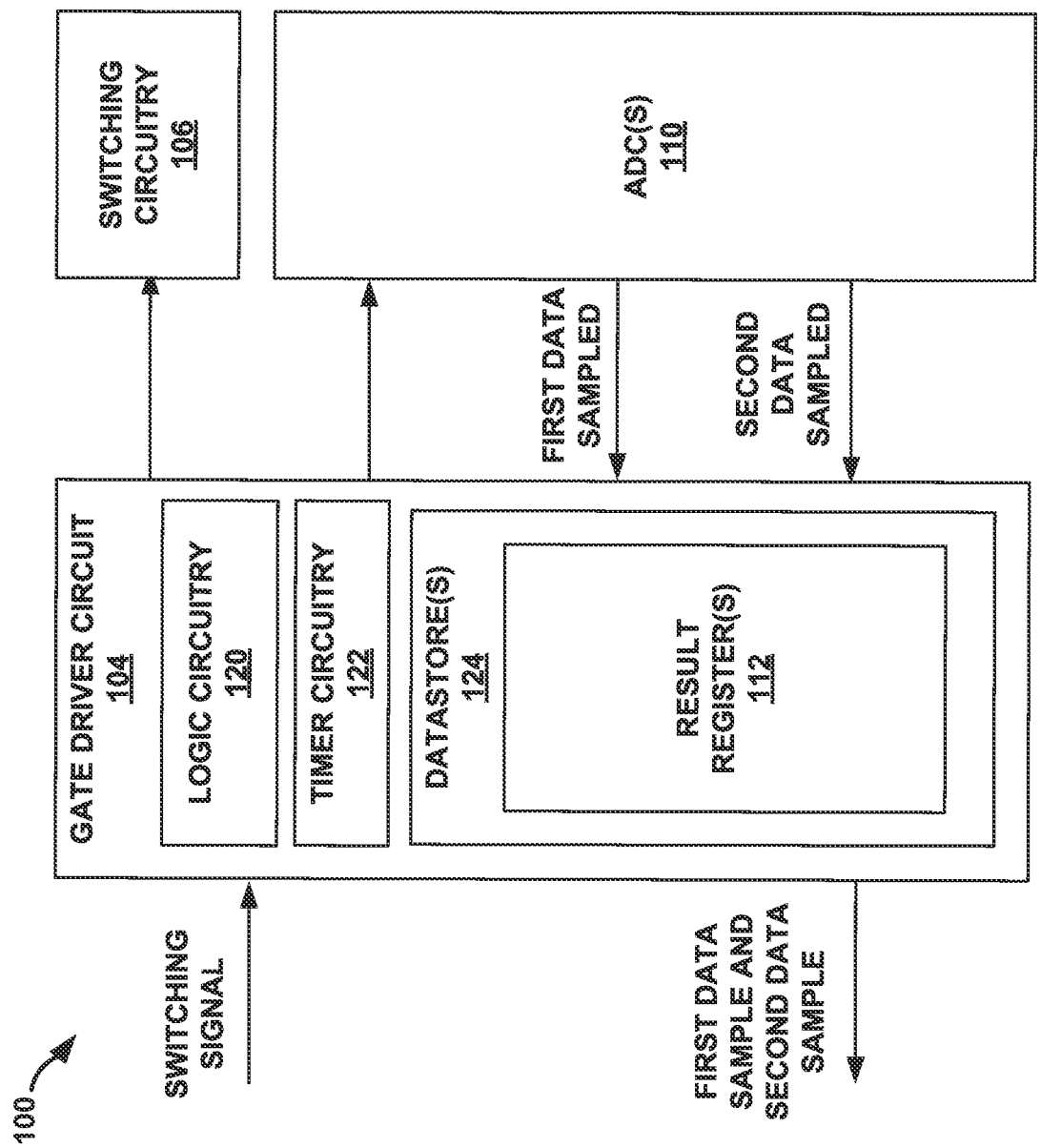
FIG. 1 is a block diagram illustrating an example system configured for sampling using both a switching signal and a timing signal, in accordance with one or more techniques of this disclosure.

The disclosure describes techniques, devices, and systems for communication, for example, communication for a gate driver. The example of a gate driver is described for example purposes only. A gate driver may include a multi-channel analog-to-digital converter (ADC), which can be trigged in each pulse-width modulation (PWM) cycle. While a PWM cycle is used as an example, techniques described herein may apply to other switching signals and may apply to other periodic signals. For each channel, the triggering point can be programmed by software independently. For example, the gate driver may determine the triggering point as the beginning or middle of a PWM ON phase or the beginning or middle of a PWM OFF phase. In some instances, the gate driver may determine the triggering point as a fixed delay after PWM ON or a fixed delay after PWM OFF. The gate driver may determine the triggering point as a middle of PWM pulse.

In accordance with the techniques of the disclosure, a gate driver may control ADCs using both the triggering point of a switching signal (e.g., a PWM cycle) and a timing signal output by timing circuitry. If PWM operation stops (e.g. a car stops driving), a timeout counter can inject triggers into the ADC to keep the monitoring alive (e.g., temperature measurement, battery monitoring). In this way, the gate driver may generate more data samples than gate drivers that rely only on triggering points of the switching signal, which may improve an accuracy of a state of a system monitored using the data samples. For instance, even if PWM has stopped, the gate driver may generate ADC conversion results of a battery voltage, a temperature, or other measurements.

The gate driver may control the ADC such that the ADC result register includes one or more bits (e.g., one bit) to show if a conversion was triggered by a regular PWM cycle or a timeout trigger. For example, the gate driver may include a first bit value (e.g., a 0) when controlling, using the PWM cycle, the ADC to store a data sample at a result register. In this example, the gate driver may include a second bit value (e.g., a 1) when controlling, using the timing signal, the ADC to store a data sample at a result register. In this way, results, which are not PWM cycle related can be identified and treated differently by a controller circuit.

In some examples, the gate driver may control the ADC such that the ADC result register includes one or more bits (e.g., one bit) to show a usage of the correct PWM ON/OFF state during the time of the ADC conversion to allow to check for correct triggering and constant PWM ON/OFF state throughout the conversion. In this way, results taken at the wrong trigger point can be identified and sorted out by the gate driver itself. For example, the gate driver may include a first bit value (e.g., a 1) in response to a determination that the PWM remains in the ON state while the ADC samples data. In this example, the gate driver may include a second bit value (e.g., a 0) in response to determination that the PWM changes states (e.g., from the ON state to the OFF state) while the ADC samples data. In some examples, the gate driver gate may include the second bit value (e.g., a 0) in response to a determination that the PWM is in the OFF state where the triggering signal is generated for the ON state. In this way, the gate driver itself can identify samples that may not be accurate, which may be less of a computational burden compared to systems relying on only receiving circuitry (e.g., a microcontroller or controller circuitry) to identify inaccurate samples.

A controller circuit (e.g., a microcontroller) may asynchronously read and at varying rates the result register. In this example, the controller circuit should be able to reassemble a continuous result stream, which is accurately timed with a periodic signal (e.g., a PWM cycle). A circuit (e.g., a gate driver or another circuit) may generate the ADC result register to include a (saturating) read counter field to help to allow the controller circuit to accurately read the result register. For example, the read counter field may indicate: (1) if the actual conversion result has been read out multiple times by the controller circuit; and (2) if the controller circuit missed to read one or multiple results. For instance, the circuit may modify a readout counter value from 0 to 1 in response to storing data to the result register. In this example, the circuit may set the readout counter value to 0 in response to a read request. In this way, a controller circuit (e.g., a microcontroller) reading the data stored to the result register may determine whether the data is valid using the readout counter value, which may be less of a computational burden compared to systems relying only on a comparison of time stamps of data retrieved from the result register.

FIG. 1 is a block diagram illustrating an example system 100 configured for sampling without a triggering point, in accordance with one or more techniques of this disclosure. System 100 includes gate driver circuit 104, switching circuitry 106, and one or more ADCs 110 (referred to herein as simply "ADCs 110"). Gate driver circuit 104 may include logic circuitry 120, timer circuitry 122, and one or more datastores 124 (referred to herein as simply "datastores 124"), which may include one or more result registers 112 (referred to herein as simply "result registers 112").

ADCs 110 may be configured to convert an analog signal to a digital value. For example, ADCs 110 may generate a data sample at the one or more result registers using a measurement of an analog signal. For instance, ADCs 110 may generate a first data sample using a measurement of one or more of a supply voltage output by switching circuitry 106, a voltage at a switching element of switching circuitry 106, a voltage output by a supply configured to power gate driver circuit 104, or a temperature.

Switching circuitry 106 may operate one or more switching elements using a switching signal. The switching signal may be output by gate driver circuit 104. For example, switching circuitry 106 may include an inverter and the switching signal may include a PWM signal. Switching circuitry 106 may represent switching circuitry to control, for example, a power converter or an electrical engine (e.g., a motor). As used herein, a switching element may include, but is not limited to, a silicon-controlled rectifier (SCR), a Field Effect Transistor (FET), and a bipolar junction transistor (BJT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same.

Gate driver circuit 104 may control switching circuitry 106 and ADCs 110. Gate driver circuit 104 include a combination of one or more analog components and one or more digital components. For example, a combination of both digital circuitry and analog circuitry of gate driver circuit 104 may perform the functions described in one or more of logic circuitry 120 and timer circuitry 122. Examples of digital circuitry may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may refer to any of the foregoing logic circuitry, alone or in combination with other logic circuitry, or any other equivalent circuitry. For instance, digital circuitry of gate driver circuit 104 may perform the functions described in one or more of logic circuitry 120 and timer circuitry 122.

Timer circuitry 122 may generate a timing signal. Timer circuitry 122 may include a timeout counter. For example, timer circuitry 122 may generate a timing signal that indicates a triggering point of the timing signal when a predetermined amount of time has elapsed since a counter of timer circuitry 122 was initiated.

Logic circuitry 120 may drive switching circuitry 106 using a switching signal. For example, logic circuitry 120 may output a PWM signal to control switching elements of switching circuitry 106. Switching circuitry 106 may control a power converter to regulate, for example, a voltage, current, or power output by the power convert. In some examples, switching circuitry 106 may control a motor, for instance, a speed or torque of the motor.

Logic circuitry 120 may determine a triggering point of a first cycle of a plurality of cycles of the switching signal. The triggering point can be programmed by software independently. For example, logic circuitry 120 may determine the triggering point as the beginning or middle of a phase of a cycle. For instance, logic circuitry 120 may determine a first transition from an off state to an on state of a first cycle of cycles of the switching signal and add a first time delay. In some instances, logic circuitry 120 may determine a second transition from the on state to the off state of the first cycle of cycles of the switching signal and add a second time delay.

In response to the determination of the triggering point, logic circuitry 120 may control, using the switching signal, ADCs 110 to store a first data sample at the one or more result registers 112. For example, logic circuitry 120 may cause ADCs 110 to generate the first data sample at a first triggering time that corresponds to (e.g., occurs at a similar time as) the triggering point of the switching signal. For instance, logic circuitry 120 may control ADCs 110 to generate the first data sample using a measurement of one or more of a supply voltage output by switching circuitry 106, a voltage at a switching element of switching circuitry 106, a voltage output by a supply configured to power gate driver circuit 104, or a temperature.

In response to a determination that a set of one or more cycles of the plurality of cycles of the switching signal does not include a triggering point, logic circuitry 120 may control, using the timing signal, the one or more ADCs to store a second data sample at the one or more result registers. For example, logic circuitry 120 may determine a triggering point of the timing signal. In this example, logic circuitry 120 may cause ADCs 110 to generate the second data sample at a second triggering time that corresponds to (e.g., occurs at a similar time as) the triggering point of the timing signal. For instance, logic circuitry 120 may control ADCs 110 to generate the second data sample using a measurement of one or more of a supply voltage output by switching circuitry 106, a voltage at a switching element of switching circuitry 106, a voltage output by a supply configured to power gate driver circuit 104, or a temperature. In this way, logic circuitry 120 may generate more data samples than gate drivers that rely only on triggering points of the switching signal, which may improve an accuracy of a state of measurements monitored. For instance, logic circuitry 120 may generate samples of temperature measurements and battery measurements when the switching circuitry 106 is not driven by the switching signal.

Figure 2:
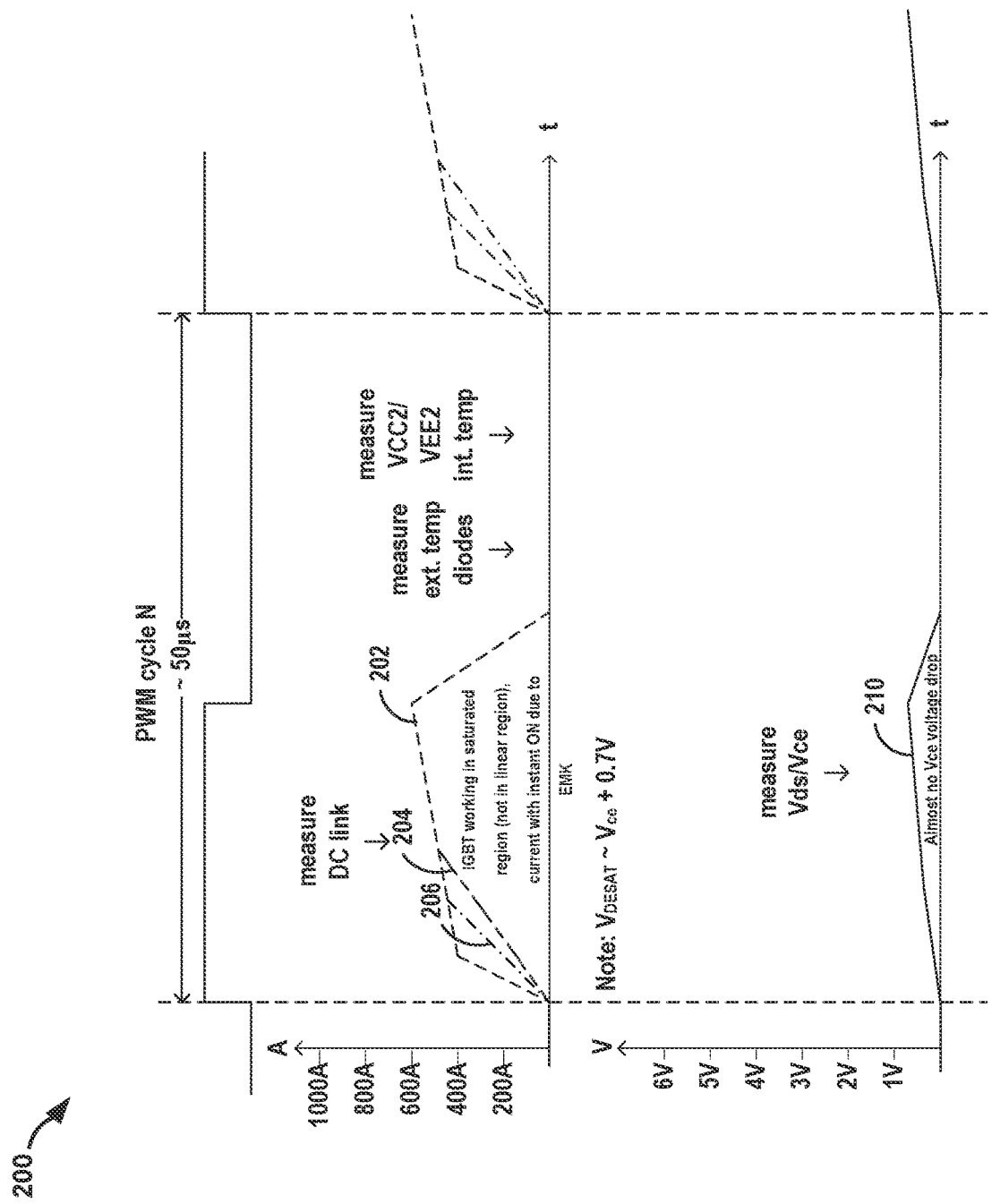
FIG. 2 is a plot diagram illustrating an example switching signal, in accordance with one or more techniques of this disclosure.

FIG. 2 is a plot diagram illustrating an example switching signal, in accordance with one or more techniques of this disclosure. FIG. 2 is discussed with reference to FIG. 1 for example purposes only. In the example of FIG. 2, ADCs 110 generate samples of measurements for a motor. However, in other examples, ADCs 110 generate samples of measurements for other devices, for example, a power converter.

Electrical engines, such as motors, may be operated by sinusoidal voltages, which may be generated by digitally controlled PWM waveforms. For example, gate driver circuit 104 may output a PWM signal to switching circuitry 106. The digitally controlled PWM waveforms may be applied to IGBT modules or SiC modules of switching circuitry 106. Switching circuitry 106 may be arranged as an inverter. For example, IGBT modules or SiC modules of switching circuitry 106 may be configured to switch between an ON state and an OFF state according to the PWM signal. Motor drive applications in electric vehicles can use a 3-phase approach with 3 separate half bridges. The 3-phases get the power from a single high voltage battery (e.g., a DC link voltage). The power output of such configurations can easily reach 100 Kilowatts (Kw).

To avoid wasting energy (e.g., keeping wasted heat low to maximize a driving range of battery, which may help to $CO_2$ emissions low), it is desirable to increase the efficiency of such inverter applications. System 100 may manipulate of a set of parameters (e.g., a PWM duty cycle, a PWM dead time, a PWM gate driver output slew rates, and/or a PWM gate driver output voltage) depending on the actual inverter state (e.g., a temperature, a battery voltage, a motor load current, etc.).

Inverters may include several dedicated ADCs 110 to measure the system state in a timer based manner, e.g. in some cases there is no relation to the PWM signal (e.g., timer only based triggers of ADC). Some gate driver circuits may provide PWM related ADC conversion triggers, but the microcontroller may not be able to relate the ADC results back to a certain PWM cycle. However, there is the need for one or more ADC conversions that are triggered in each PWM cycle. In this way, the microcontroller can read in real time and assemble a PWM cycle accurate result stream. For example, the microcontroller may measure a DC link voltage value for each PWM cycle and/or the Vds drop across the SiC module (respectively Vce drop across IGBT module). The microcontroller, with inverter software, may combine the parameters of the system state with the phase current which is measured with external Hall elements to control gate driver circuit 104.

The horizontal axis (x-axis) of FIG. 2 represents time (t) and the vertical axis (y-axis) of FIG. 2 represents first measured DC link current 202, second measured DC link current 204, and third measured DC link current 206 in amps (A) and a measured voltage 210 in volts. As shown, first measured DC link current 202 overlaps a portion of second measured DC link current 204 and third measured DC link current 206 in FIG. 2. It may be desirable for gate driver circuit 104 to cause ADCs 110 to sample measured voltage 210 based on cycles of the switching signal (e.g., a PWM cycle). For example, gate driver circuit 104 may cause ADCs 110 to sample measured voltage 210 at a middle of the PWM cycle N, which is illustrated as approximately 50 microseconds (μs).

Gate driver circuit 104 may cause ADCs 110 to sample various measurements based on cycles of the switching signal (e.g., a PWM cycle). For example, gate driver circuit 104 may cause ADCs 110 to sample a measured DC link voltage in each PWM cycle, which may allow a microcontroller to accurately calculate the injected power (torque) in the engine. For instance, gate driver circuit 104 may cause ADCs 110 to sample the measuring DC link voltage in a zero current PWM cycle to obtain an accurate sample of the battery voltage. PWM cycle triggered measurements without hard real time requirements may include, for example, an external temperature of diodes or a supply voltage (e.g., VCC2/VEE2) of gate driver circuit 104.

Gate driver circuit 104 may cause ADCs 110 to sample a measured voltage drain-to-source (Vds) across the SiC module in each PWM cycle, which may allow the microcontroller to calculate the imposed stress on the module and/or predict and monitor lifetime effects. For instance, the microcontroller may use the sampled Vds across the SiC module in each PWM cycle to estimate a change in an on resistance (Rdson) of the SiC module over a lifetime of the SiC module.

Systems where the gate driver circuit 104 does not cause the ADCs 110 to sample based on the switching signal may not get the benefits out of the additional measurements. For example, in such systems, the microcontroller may merge the measurements sampled by ADCs with a PWM cycle accurate with the inverter current measurements. Microcontrollers may not read out the results from multiple ADCs in a PWM cycle accurate manner, and merging the measurements with a PWM cycle may be a computational burden (e.g., synchronous conversion triggering, synchronous ADC result read out, etc.).

Figure 3:
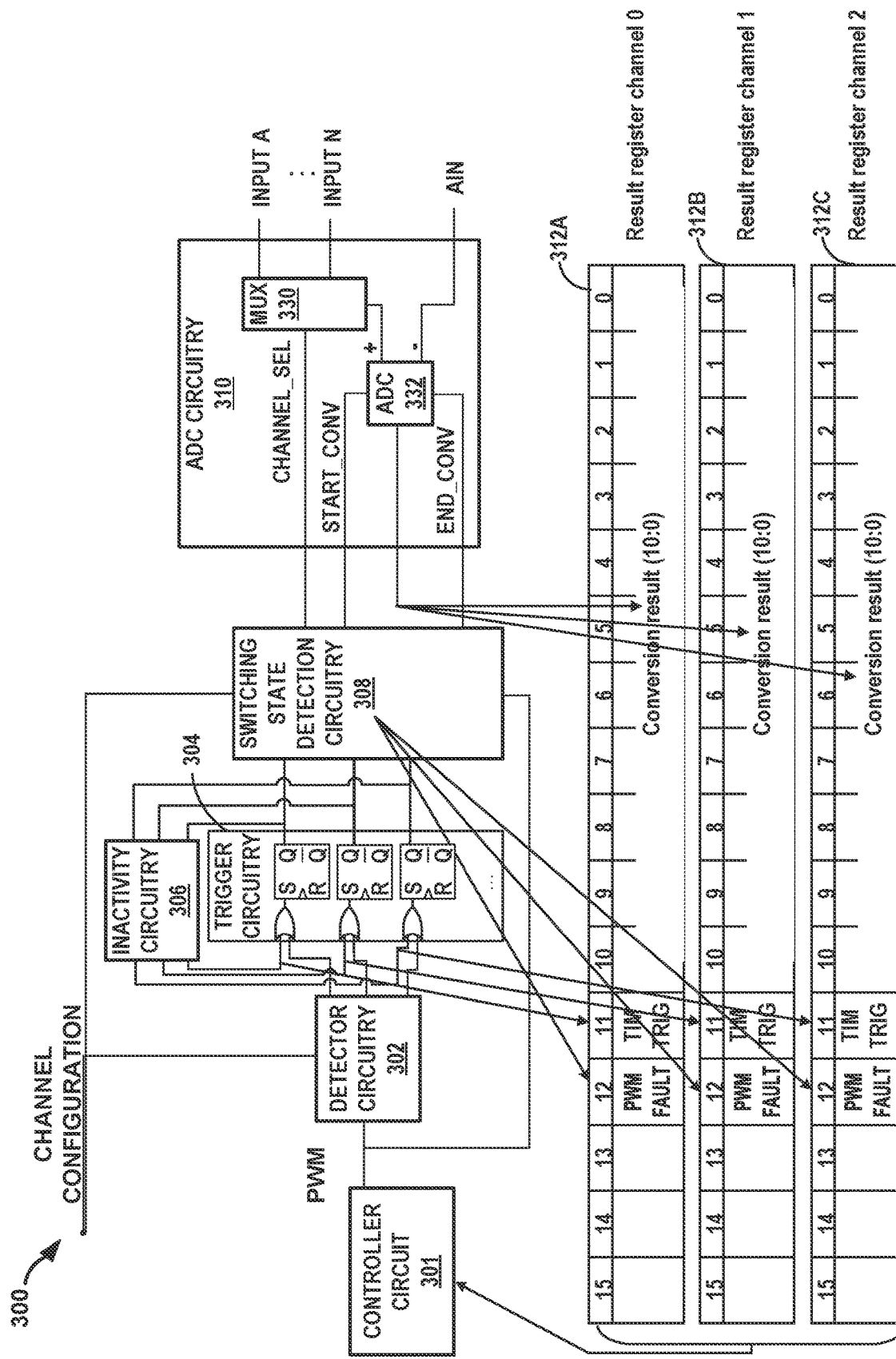
FIG. 3 is a conceptual diagram of generating result registers for sampling using both a switching signal and a timing signal, in accordance with one or more techniques of this disclosure.

FIG. 3 is a conceptual diagram of result registers 312A-312C for sampling using both a switching signal and a timing signal, in accordance with one or more techniques of this disclosure. FIG. 3 is discussed with reference to FIGS. 1-2 for example purposes only. System 300 includes controller circuit 301, detector circuitry 302, trigger circuitry 304, switching state detection circuitry 308, and ADC circuitry 310. One or more of controller circuitry 301, trigger circuitry 304, switching state detection circuitry 308 may be an example of logic circuitry 120 of FIG. 1. Inactivity circuitry 306 may be an example of timer circuitry 122 of FIG. 1.

Controller circuit 301 may output a switching signal, such as, for example, a PWM signal. Detector circuitry 302 may determine a triggering point of a first cycle of cycles of the switching signal. For example, detector circuitry 302 may receive the switching signal from controller circuit 301 and may generate a first triggering signal using the switching signal. Detector circuitry 302 may determine the first triggering signal to include a respective first triggering point that corresponds to a midpoint of a PWM signal. For instance, detector circuitry 302 may determine a first transition from an off state to an on state of a first cycle of cycles of the switching signal and add a first time delay. In some instances, detector circuitry 302 may determine a second transition from the on state to the off state of the first cycle of cycles of the switching signal and add a second time delay.

In response to the determination of the triggering point, detector circuitry 302 may control, using the switching signal, ADC 332 to store a first data sample at result registers 312A-312C (collectively referred to herein as "result registers 312"). For example, the first triggering point of the first triggering signal may set a set-reset latch of trigger circuitry 304. In this example, the setting of the set-reset latch of trigger circuitry 304 may control MUX 330 (e.g., select a channel) to cause MUX 330 output an input (e.g., input A) that represents a measured value to ADC 332. In this example, ADC 332 may output, to result registers 312, a first data sample (e.g., a digital representation of the measured value). As shown, system 100 may output the first data sample and the second data sample to controller circuit 301, which may represent processing circuitry, such as, for example, a microcontroller.

In response to a determination that a set of one or more cycles of the cycles of the switching signal does not include a triggering point, inactivity circuitry 306 may control, using the timing signal, ADC 332 to store a second data sample at result registers 312. For example, inactivity circuitry 306 may be configured to generate a second triggering signal using a timing signal. For instance, inactivity circuitry 306 may be configured to generate the second triggering signal using a timing signal after a predefined amount of time has elapsed since a triggering point has indicated by detector circuitry 302. Inactivity circuitry 306 may include a timeout counter.

For example, inactivity circuitry 306 may generate the timing signal that indicates a triggering point of the timing signal when a predetermined amount of time has elapsed since a counter of the timer circuitry was initiated. For instance, inactivity circuitry 306 may generate the timing signal to indicate a second triggering point when a predetermined amount of time has elapsed since a counter of the timeout counter was initiated. In this example, a second triggering point of the second triggering signal may set a set-reset latch of trigger circuitry 304. The setting of the set-reset latch of trigger circuitry 304 may control MUX 330 to output an input (e.g., input A) that represents a measured value to ADC 332, which outputs a second data sample (e.g., a digital representation of the measured value) to result registers 312. As shown, system 300 may output the second data sample and the second data sample to controller circuit 301.

Configuring trigger circuitry 304 to cause ADC 332 to sample data for one or more parameters in response to each respective first triggering point of the first triggering signal and each respective second triggering point of the second triggering signal may cause ADC 332 to generate more data samples than systems that rely only on triggering points of the switching signal (e.g., triggering points generated by detector circuitry 302), which may improve an accuracy of a state of a system monitored using the data samples. For instance, even if PWM has stopped, inactivity circuitry 306 may generate ADC conversion results of a battery voltage, a temperature, or other measurements.

Controller circuit 301 may generate the switching signal based on the first data sample and the second data sample. For example, controller circuit 301 may manipulate of a set of parameters (e.g., a PWM duty cycle, a PWM dead time, a PWM gate driver output slew rates, and/or a PWM gate driver output voltage) depending on the actual inverter state (e.g., a temperature, a battery voltage, a motor load current, etc.).

Trigger circuitry 304 may be configured to generate a first value indicating that the first data sample is generated using the switching signal and to store the first value at the one or more result registers. For example, trigger circuitry 304 may generate result register 312A to include a status bit timing trigger "TIMTRIG" with the first value (e.g., a 0) to show a switching signal based triggering. In this example, trigger circuitry 304 may generate a second value indicating that the second data sample is generated using the timing signal and to store the second value at result register 312B. For example, trigger circuitry 304 may generate result register 312B to include a status bit timing trigger "TIMTRIG" with the second value (e.g., a 1) to show a timer based triggering in case of missing PWM toggle operation (e.g., car not driving).

Switching state detection circuitry 308 may generate a value indicating whether the switching signal indicated only one switching state while the trigger circuitry causes the one or more ADCs to the sample data for the one or more parameters. For example, switching state detection circuitry 308 may generate status bit "PWMFAULT" which indicates whether the analog-to-digital conversion performed by ADC 332 occurred a) at wrong PWM state and/or b) PWM state changed during conversion. For instance, switching state detection circuitry 308 may generate a first value (e.g., 0 or 1) indicating whether the switching signal indicated only one switching state while ADC 332 sampled the first sample data. The switching state may include an on state (e.g., PWM ON) or an off state (e.g., PWM OFF). Similarly, switching state detection circuitry 308 may generate a second value indicating whether the switching signal indicated only one switching state while the one or more ADCs sampled the second sample data.

Figure 4:
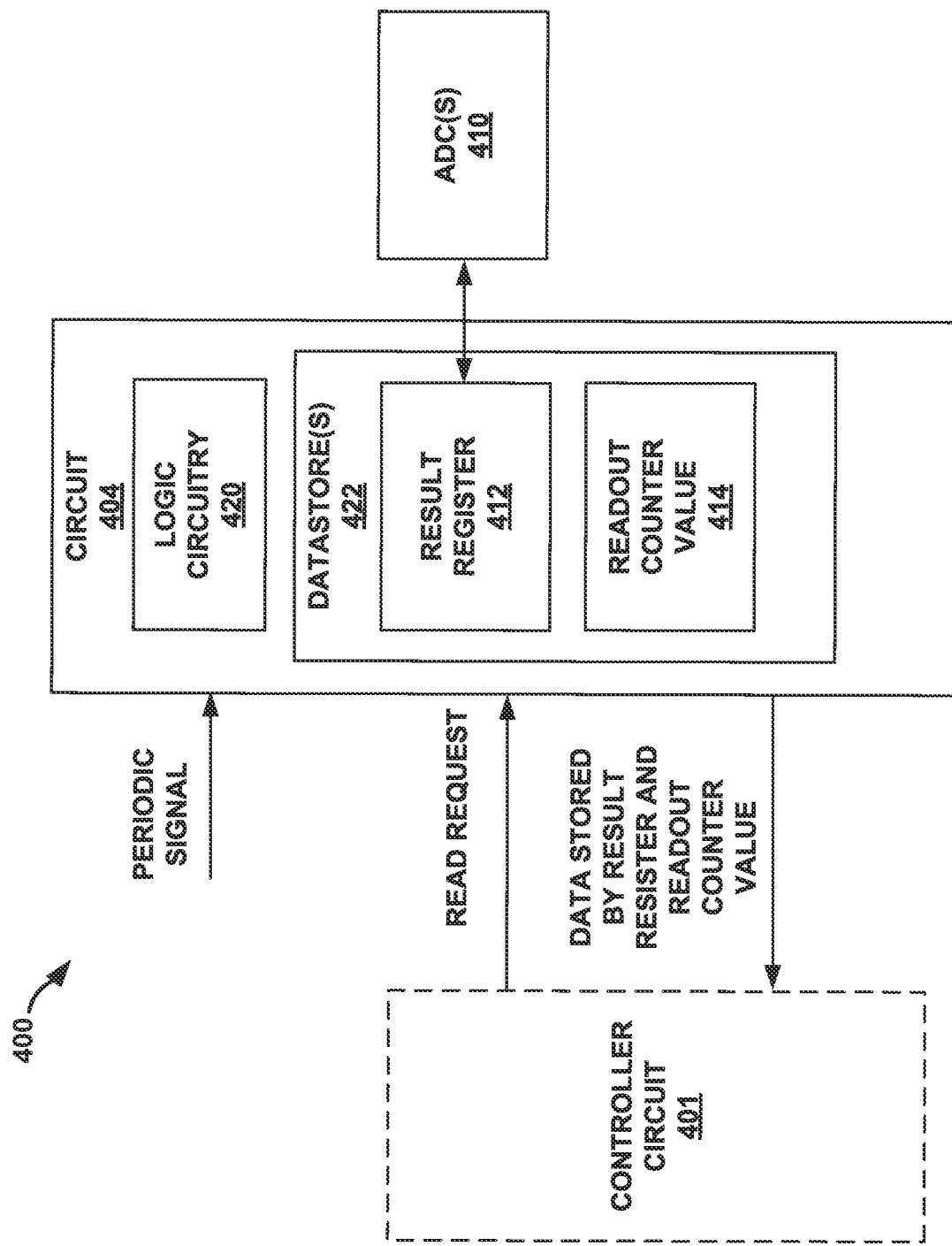
FIG. 4 is a block diagram illustrating an example system configured for a readout counter value, in accordance with one or more techniques of this disclosure.

FIG. 4 is a block diagram illustrating an example system configured for a readout counter value, in accordance with one or more techniques of this disclosure. FIG. 4 is discussed with reference to FIGS. 1-3 for example purposes only. System 400 includes circuit 404 and one or more ADCs 410 (also referred to herein as simply "ADCs 410"). System 400 may optionally include controller circuit 401. ADCs 410 may be configured to convert an analog signal to a digital value. For example, ADCs 410 may generate a data sample at one or more result registers 412 of one or more datastores 422 using a measurement of an analog signal.

Circuit 404 may control ADCs 410. Circuit 404 may include a combination of one or more analog components and one or more digital components. Circuit 404 may include logic circuitry 420, one or more datastores 422 (also referred to herein as simply "datastore 422"). Datastore 422 may store one or more result registers 412 (also referred to herein as simply "result register 412") and a readout counter value 414.

Logic circuitry 420 may cause, for a cycle of a plurality of cycles of a periodic signal, ADCs 410 to store data to result register 412. For example, logic circuitry 420 may determine a first transition of the periodic signal from an off state to an on state and add a first time delay. In some examples, logic circuitry 420 may determine a second transition of the periodic signal from the on state to the off state and add a second time delay. In some examples, the periodic signal includes a PWM signal. Logic circuitry 420 may drive, using the PWM signal, switching circuitry, such as, for example, an inverter.

Logic circuitry 420 may modify readout counter value 414 in response to ADCs 410 storing the data to result register 412 for the cycle. For example, logic circuitry 420 may increment the readout counter value. In response to a read request for the data at result register 412 for the cycle, logic circuitry 420 may output the data stored by result register 412, output readout counter value 414 for the cycle, and, after the output of readout counter value 414, set readout counter value 414 to a predetermined value. The predetermined value may be zero.

Logic circuitry 420 may output the data stored by result register 412 and readout counter value 414 on a serial bus to a controller circuit 401. In some examples, logic circuitry 420 may receive the periodic signal from the controller circuit 401.

Figure 5:
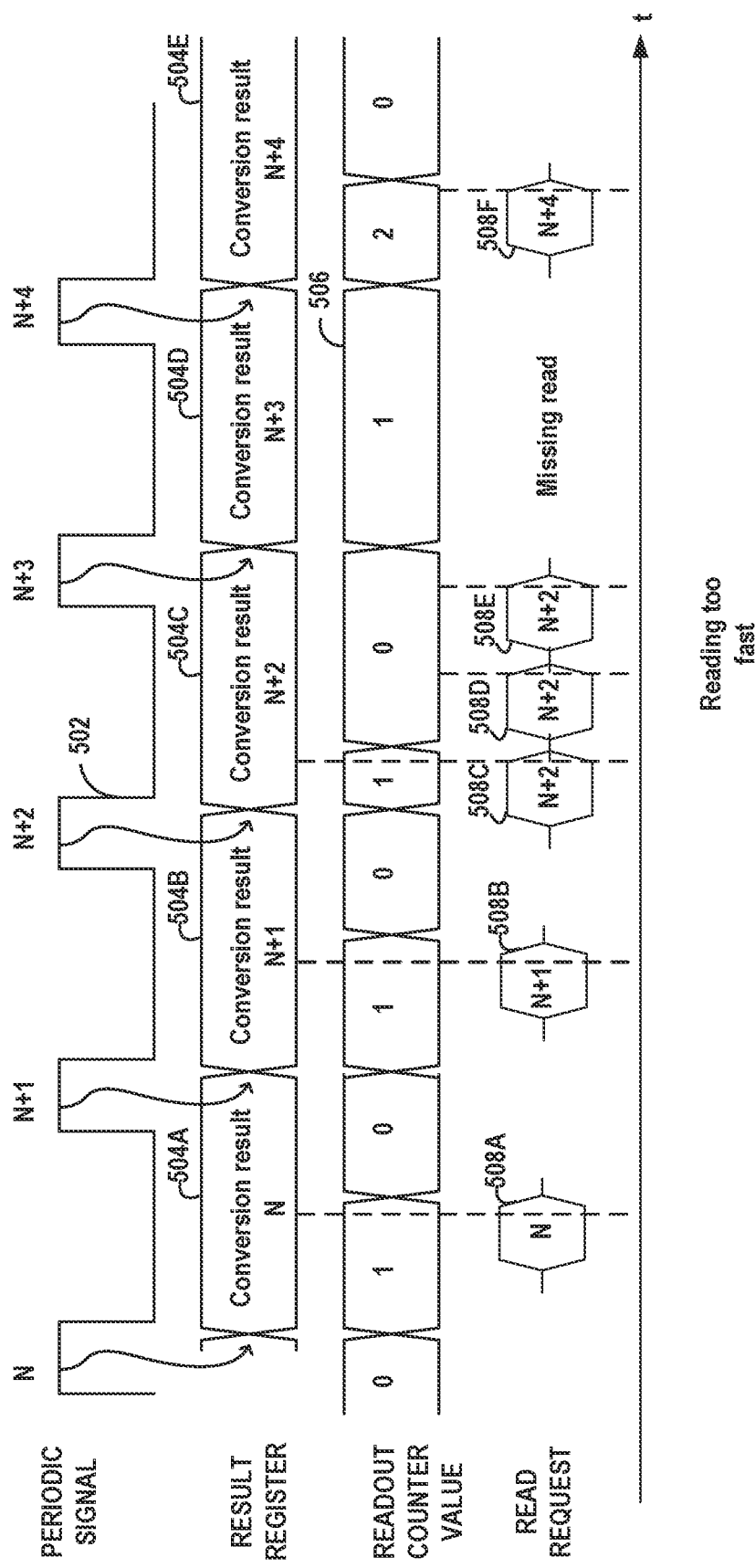
FIG. 5 is a plot diagram illustrating an example periodic signal and readout counter value, in accordance with one or more techniques of this disclosure.

FIG. 5 is a plot diagram illustrating an example periodic signal and readout counter value, in accordance with one or more techniques of this disclosure. FIG. 5 is discussed with reference to FIGS. 1-4 for example purposes only. The horizontal axis (x-axis) of FIG. 5 represents time (t) and the vertical axis (y-axis) of FIG. 5 represents a periodic signal 502 in volts, conversion results 504A-504E (collectively referred to herein as "conversion results 504") stored in result register 412 that each represent a set of one or more bit values, a readout counter values 506 representing a bit value (e.g., 0 or 1), and read requests 508A-508F.

In the example of FIG. 5, when readout counter value 506 is equal to zero, circuit 404, or more specifically, for example, logic circuitry 420 and/or controller circuit 401 may determine that there are no new conversion result available and/or that a double read out has occurred. For example, logic circuitry 420 may drop conversion result 504C in response to a determination that readout counter value 506 is equal to zero when receiving read request 508D (e.g., conversion result 504C was already output when receiving read request 508C).

When readout counter value 506 is equal to one, circuit 404, or more specifically, for example, logic circuitry 420 and/or controller circuit 401 may determine that exactly one new conversion result is available. For example, logic circuitry 420 may output conversion result 504B for use by controller circuit 401 in response to a determination that readout counter value 506 is equal to one when receiving read request 508B.

When readout counter value 506 is equal to two, circuit 404, or more specifically, for example, logic circuitry 420 and/or controller circuit 401 may determine that one conversion result has been missed to read out. For example, logic circuitry 420 may output conversion result 504E with readout counter value 506 set to two when receiving read request 508F. In some examples, circuit 404, or more specifically, for example, logic circuitry 420, and/or controller circuit 401 may interpolate the missed conversion result.

When readout counter value 506 is equal to three, circuit 404, or more specifically, for example, logic circuitry 420 and/or controller circuit 401 may determine that two conversion results have been missed to read out. For example, logic circuitry 420 may output a conversion result for use by controller circuit 401 with readout counter value 506 set equal to three when receiving a read request. In some examples, circuit 404, or more specifically, for example, logic circuitry 420, and/or controller circuit 401 may interpolate the missed conversion results. Table 1 lists the results of the example cycles of FIG. 5.

TABLE 1

| CONVERSION RESULT | READOUT COUNTER | READOUT STATUS STATE | CONVERSION RESULT STATE |
|---|---|---|---|
| N | 1 | | |
| N + 1 | 1 | | |
| N + 2 | 1 | | |
| N + 2 | 0 | READ TWICE | NOT VALID |
| N + 2 | 0 | READ TWICE | NOT VALID |
| N + 4 | 2 | ONE RESULT LOST | INTERPOLATE MISSING RESULT |

Circuit 404, or more specifically, for example, logic circuitry 420 may update the ADC conversion results asynchronously to controller circuit 401 (e.g., a microcontroller). For example, circuit 404 may output the conversion results 504 to controller circuit 401 using a serial bus. Nevertheless, controller circuit 401 can reassemble a cycle accurate result chain (e.g., one result per PWM cycle) using readout counter value 506. In this way, system 400 may avoid a comparison of time stamps between two consecutive samples to reduce calculation effort, for example, by controller circuit 401. Instead, each ADC result value itself contains a standalone valid marker.

For example, circuit 404, or more specifically, for example, logic circuitry 420 may cause, for a cycle of a plurality of cycles of periodic signal 502, ADCs 410 to store data to result register 412 of datastore 422. For example, logic circuitry 420 may cause ADCs 410 to generate conversion results 504 at each one of cycles N, N+1, N+2, N+3, and N+4 of periodic signal 502. Logic circuitry 420 may modify readout counter value 506 in response to the ADCs 410 storing conversion results 504 to result register 412 for the cycle.

For example, logic circuitry 420 may, in response to read request 508A for conversion result 504A at result register 412 for the previous cycle (e.g., N), set readout counter value 506 to the predetermined value (e.g., 0). In this example, logic circuitry 420 may modify readout counter value 506 in response to ADCs 410 storing conversion results 504 to result register 412 for the previous cycle (e.g., N). For instance, logic circuitry 420 may increment readout counter value 506 (e.g., from 0 to 1).

In response to read request 508B for the data at result register 412 for the cycle (e.g., N+1), logic circuitry 420 may output conversion result 504B stored by result register 412, output readout counter value 506 (e.g., 1) for the cycle (N+1), and, after the output of readout counter value 506, set readout counter value 506 to a predetermined value (e.g., 0).

In the above examples, the current cycle represented cycle 'N+1' of periodic signal 502 to illustrate an example situation when exactly one new conversion result is available. In the proceeding example, the current cycle or simply "cycle" may represent cycle 'N+2' of periodic signal 502 to illustrate an example situation when there is no new conversion result available and/or that a double read out has occurred. For example, in response to read request 508C for the data at result register 412 for the cycle (e.g., N+2), logic circuitry 420 may output conversion result 504C stored by result register 412, output readout counter value 506 (e.g., 1) for the cycle (N+2), and, after the output of readout counter value 506, set readout counter value 506 to a predetermined value (e.g., 0).

Circuit 404, or more specifically, for example, logic circuitry 420 may receive, during the cycle (e.g., N+2), a subsequent read request 508D for the data at result register 412 for the cycle (N+2). In response to subsequent read request 508D for the data at result register 412 for the cycle (N+2), logic circuitry 420 may output readout counter value 506 for the cycle (N+2) that is set to the predetermined value (e.g., 0). In some examples, logic circuitry 420 may, in response to subsequent read request 508D for the data at result register 412 for the cycle (e.g., N+2), output conversion result 504C at result register 412 for the cycle.

In the proceeding example, the current cycle may again represent cycle 'N+2' of periodic signal 502 but also refer also to cycles N+3 and N+4 of periodic signal 502 to illustrate an example situation when one or more conversion results has been missed to read out. For example, in response to read request 508C for the data at result register 412 for the cycle (e.g., N+2), logic circuitry 420 may output conversion result 504C stored by result register 412, output readout counter value 506 (e.g., 1) for the cycle (N+2), and, after the output of readout counter value 506, set readout counter value 506 to a predetermined value (e.g., 0).

In this example, however, circuit 404, or more specifically, for example, logic circuitry 420 may modify readout counter value 506 from the predetermined value to a first modified value (e.g., 1) in response to ADCs 410 storing data to result register 412 for a second cycle (e.g., N+3). In this example, logic circuitry 420 may modify readout counter value 506 from the first modified value to a second modified value (e.g., 2) in response to ADCs 410 storing the data to result register 412 for the third cycle (e.g., N+4). In this example, logic circuitry 420 may receive, during the third current cycle, a second read request 508F for the data at result register 412. In response to the second read request for the data at result register 412 for the third cycle, logic circuitry 420 may output the data stored by result register 412 for the third cycle, output readout counter value 506 for the third cycle that indicates the second modified value (e.g., 2), and, after the output of readout counter value 506, set the readout counter value to the predetermined value (e.g., 0).

Figure 6:
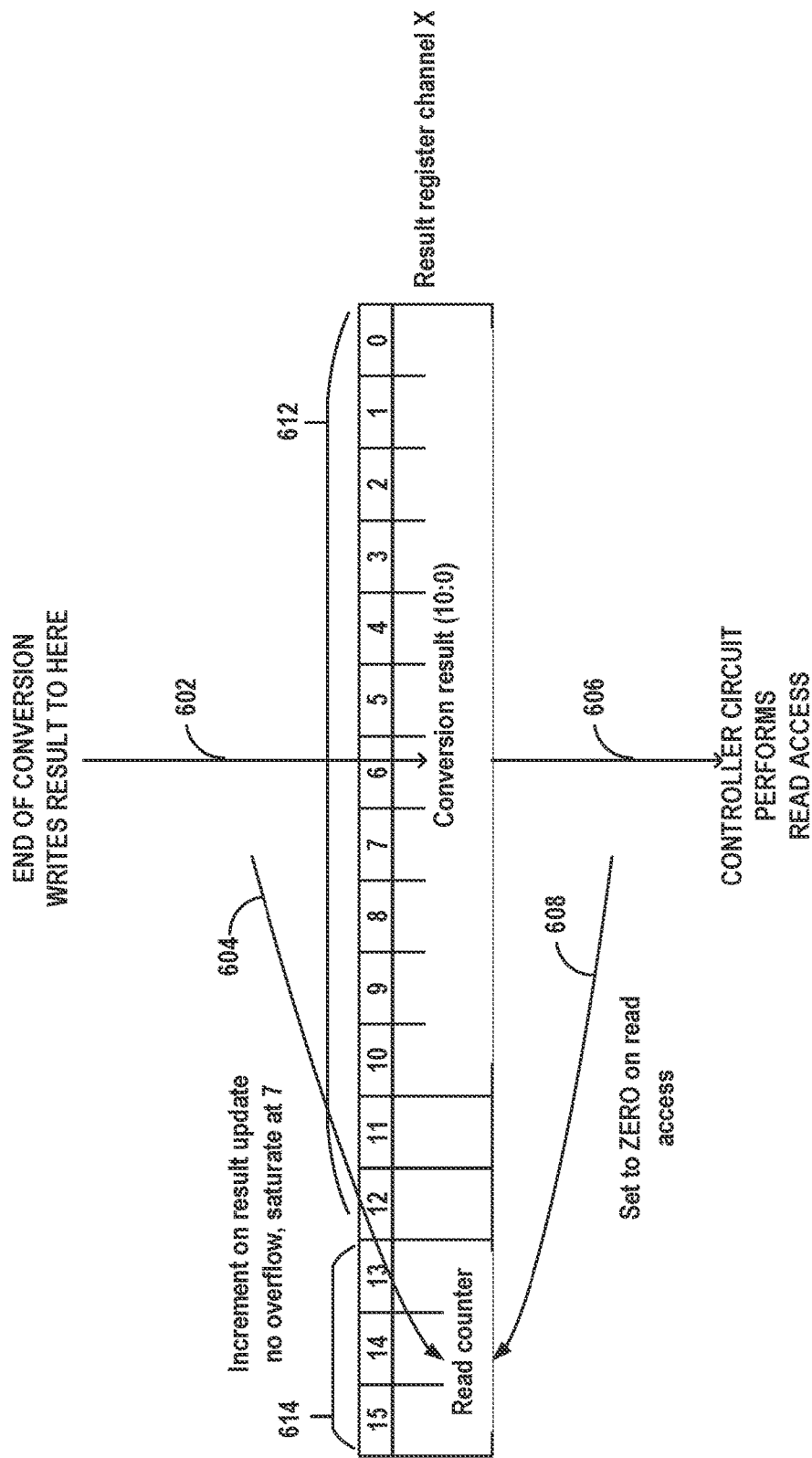
FIG. 6 is a conceptual diagram of a conversion result and readout counter value, in accordance with one or more techniques of this disclosure.

FIG. 6 is a conceptual diagram of a conversion result 612 and readout counter value 614, in accordance with one or more techniques of this disclosure. FIG. 6 is discussed with reference to FIGS. 1-5 for example purposes only.

In the example of FIG. 6, ADCs 410 may perform a conversion of an analog value to a digital value (e.g., end of conversion) and write the conversion result 612 at a result register channel X (602). In this example, circuit 404, or more specifically, for example, logic circuitry 420 may, increment readout counter value 614 (604) in response to the ADCs 410 writing conversion result 612. Controller circuit 401 may perform a read access (606) of conversion result 612. In this example, in response to the read access, logic circuitry 420 may set readout counter value 614 to zero (608).

Logic circuitry 420 may read and store readout counter value 614 in datastore 422. As shown, readout counter value 614 may saturates at a max value (e.g., 7). However, when logic circuitry 420 increments from the max value, there may be no overflow. In this way, conversion result 612 may be preserved. Controller circuit 401 may access both conversion result 612 and readout counter value 614 to reassemble the accurate periodic cycle (e.g., a PWM cycle) conversion sequence.

Figure 7:
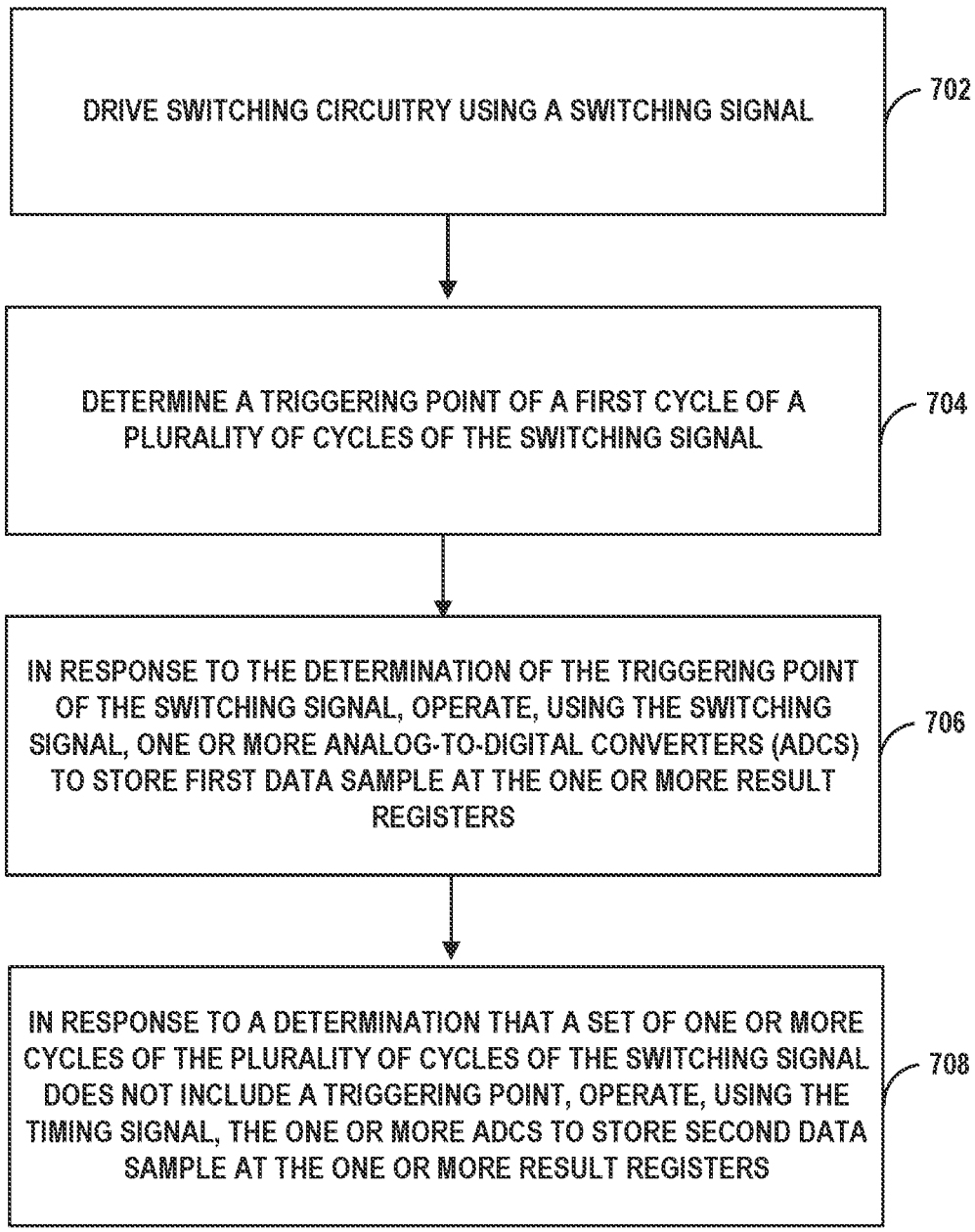
FIG. 7 is a flow diagram for sampling without a triggering point, in accordance with this disclosure.

FIG. 7 is a flow diagram showing a technique for sampling without a triggering point, in accordance with this disclosure. FIG. 7 is discussed from the perspective of the circuit shown in FIG. 1 for example purposes only, although other devices or circuits could perform the techniques of FIG. 7.

Gate driver circuit 104, or more specifically, for example, logic circuitry 120 may drive switching circuitry using a switching signal (702). The switching circuitry may include an inverter. In some examples, the switching signal comprises a pulse width modulated (PWM) signal.

Gate driver circuit 104, or more specifically, for example, logic circuitry 120 may determine a triggering point of a first cycle of a plurality of cycles of the switching signal (704). For example, logic circuitry 120 may determine a first transition from an off state to an on state of the first cycle of the plurality of cycles of the switching signal and add a first time delay. In some examples, logic circuitry 120 may determine a second transition from the on state to the off state of the first cycle of the plurality of cycles of the switching signal and add a second time delay.

In response to the determination of the triggering point, gate driver circuit 104, or more specifically, for example, logic circuitry 120 may control, using the switching signal, ADCs 110 to store a first data sample at result registers 112 (706). For example, logic circuitry 120 may cause ADCs 110 to generate the first data sample at a first triggering time that corresponds to the triggering point of the switching signal. For instance, logic circuitry 120 may cause one or more ADCs 110 to generate the first data sample using a measurement of one or more of a supply voltage output by the switching circuitry, a voltage at a switching element of the switching circuitry, a voltage output by a supply configured to power the gate driver circuit, or a temperature.

In response to a determination that a set of one or more cycles of the plurality of cycles of the switching signal does not include a triggering point, gate driver circuit 104, or more specifically, for example, logic circuitry 120 may control, using the timing signal, ADCs 110 to store a second data sample at result registers 112 (708). For example, logic circuitry 120 may determine a triggering point of the timing signal and cause ADCs 110 to generate the second data sample at a second triggering time that corresponds to the triggering point of the timing signal. For instance, timer circuitry 122 may indicate the triggering point of the timing signal when a predetermined amount of time has elapsed since a counter of timer circuitry 122 was initiated. In some examples, inactivity circuitry 306 may generate a second triggering signal using the timing signal. Logic circuitry 120 may cause ADCs 110 to generate the second data sample using a second measurement of one or more of the supply voltage output by the switching circuitry, the voltage output by the supply configured to power the gate driver circuit, or the temperature.

Logic circuitry 120 may output the first data sample and the second data sample. For example, logic circuitry 120 may output the first data sample and the second data sample to controller circuit 301. In this example, logic circuitry 120 may receive the switching signal from controller circuit 301. In some examples, the switching signal is generated by controller circuitry 301 based on the first data sample and the second data sample. For instance, controller circuit 301 may manipulate of a set of parameters (e.g., a PWM duty cycle, a PWM dead time, a PWM gate driver output slew rates, and/or a PWM gate driver output voltage) depending on the actual inverter state (e.g., a temperature, a battery voltage, a motor load current, etc.).

In some examples, gate driver circuit 104, or more specifically, for example, logic circuitry 120 may indicate whether samples are generated using the switching signal or the timing signal. For example, logic circuitry 120 may generate a first value indicating that the first data sample is generated when logic circuitry 120 controlled one or more ADCs 110 using the switching signal and to store the first value at one or more result registers 112 of datastores 124. In this example, logic circuitry 120 may generate a second value indicating that the second data sample is generated when logic circuitry 120 controlled one or more ADCs 110 using the timing signal and to store the second value at one or more result registers 112.

Gate driver circuit 104, or more specifically, for example, logic circuitry 120 may indicate whether samples are generated in a consistent switching state. For example, logic circuitry 120 may generate a first value indicating whether the switching signal indicated only one switching state while one or more ADCs sampled 110 the first sample data. The switching state may include an on state or an off state. In this example, logic circuitry 120 may generate a second value indicating whether the switching signal indicated only one switching state while one or more ADCs 110 sampled the second sample data.

Figure 8:
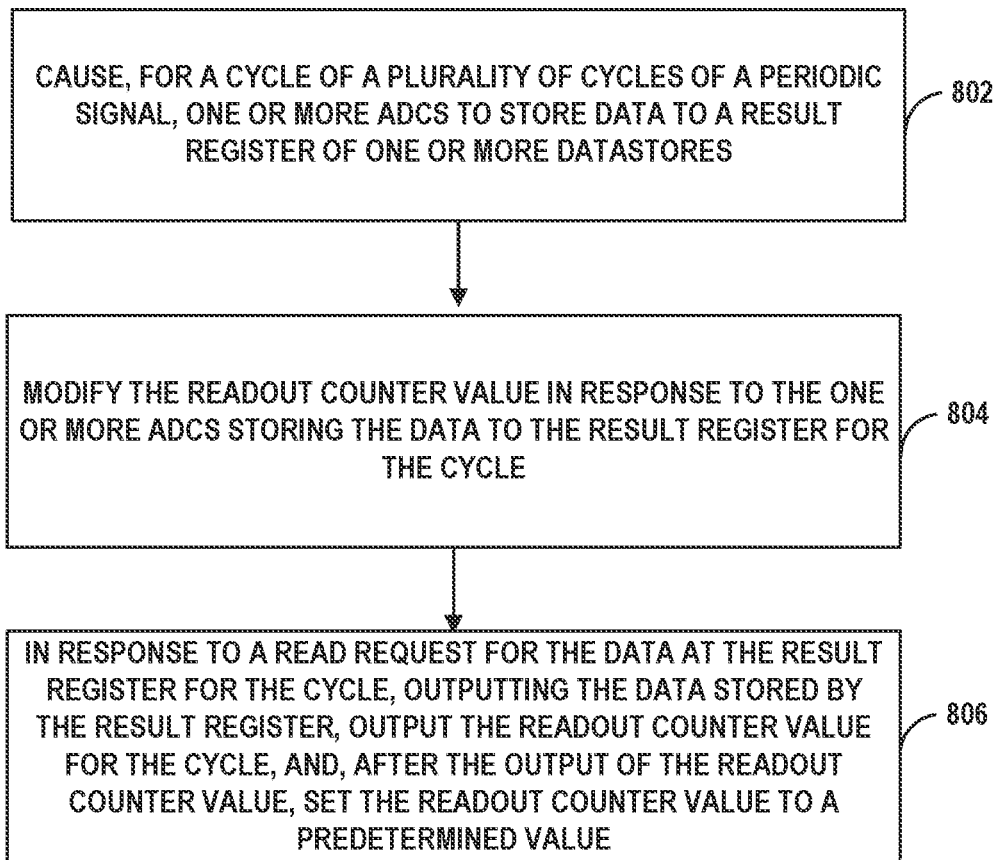
FIG. 8 is a flow diagram for generating a readout counter value, in accordance with this disclosure.

FIG. 8 is a flow diagram showing a technique for generating a readout counter value, in accordance with this disclosure. FIG. 8 is discussed from the perspective of the circuit shown in FIG. 4 for example purposes only, although other devices or circuits could perform the techniques of FIG. 8.

Circuit 404, or more specifically, for example, logic circuitry 420 may cause, for a cycle of a plurality of cycles of a periodic signal, ADCs 410 to store data to result register 412 (802). For example, logic circuitry 420 may cause ADCs 410 to generate conversion results 504 at each one of cycles N, N+1, N+2, N+3, and N+4 of periodic signal 502. For instance, logic circuitry 420 may determine a first transition of periodic signal 502 from an off state to an on state and add a first time delay as shown in FIG. 5. In some examples, logic circuitry 420 may the cause ADCs 410 to generate conversion results 504 differently than shown in FIG. 5. For example, logic circuitry 420 may determine a second transition of the periodic signal from the on state to the off state and add a second time delay and cause ADCs 410 to generate conversion results 504 during the second transition. In some examples, the periodic signal may be a PWM signal. For instance, circuit 404 may be configured to drive switching circuitry (e.g., an inverter) using the PWM signal. However, in other examples, the periodic signal may be different.

Logic circuitry 420 may modify readout counter value 414 in response to ADCs 410 storing the data to result register 412 for the cycle (804). For example, logic circuitry 420 may modify readout counter value 506 in response to ADCs 410 storing conversion result 504B to result register 412 for the cycle (e.g., N+1). For example, logic circuitry 420 may increment readout counter value 414 (e.g., from 0 to 1).

Logic circuitry 420 may, in response to a read request for the data at result register 412 for the cycle, output the data stored by result register 412, output readout counter value 414 for the cycle, and, after the output of readout counter value 414, set readout counter value 414 to a predetermined value (806). The predetermined value may be zero. For instance, in response to read request 508B for the data at result register 412 for the cycle (e.g., N+1), logic circuitry 420 may output conversion result 504B stored by result register 412, output readout counter value 506 (e.g., 1) for the cycle (N+1), and, after the output of readout counter value 506, set readout counter value 506 to the predetermined value (e.g., 0).

In the proceeding example, the current cycle or simply "cycle" may represent cycle 'N+2' of periodic signal 502 to illustrate an example situation when there is no new conversion result available and/or that a double read out has occurred. For example, logic circuitry 420 may receive, during the cycle (e.g., N+2), a subsequent read request 508D for the data at result register 412 for the cycle (N+2). In response to subsequent read request 508D for the data at result register 412 for the cycle (N+2), logic circuitry 420 may output readout counter value 506 for the cycle (N+2) that is set to the predetermined value (e.g., 0). In some examples, logic circuitry 420 may, in response to subsequent read request 508D for the data at result register 412 for the cycle (e.g., N+2), output conversion result 504C at result register 412 for the cycle.

In the proceeding example, the current cycle may again represent cycle 'N+2' of periodic signal 502 but also refer also to cycles N+3 and N+4 of periodic signal 502 to illustrate an example situation when one or more conversion results has been missed to read out. For example, logic circuitry 420 may modify readout counter value 506 from the predetermined value to a first modified value (e.g., 1) in response to ADCs 410 storing data to result register 412 for a second cycle (e.g., N+3). In this example, logic circuitry 420 may modify readout counter value 506 from the first modified value to a second modified value (e.g., 2) in response to ADCs 410 storing the data to result register 412 for the third cycle (e.g., N+4). In this example, logic circuitry 420 may receive, during the third current cycle, a second read request 508F for the data at result register 412. In response to the second read request for the data at result register 412 for the third cycle, logic circuitry 420 may output the data stored by result register 412 for the third cycle, output readout counter value 506 for the third cycle that indicates the second modified value (e.g., 2), and, after the output of readout counter value 506, set the readout counter value to the predetermined value (e.g., 0).

Figure 9:
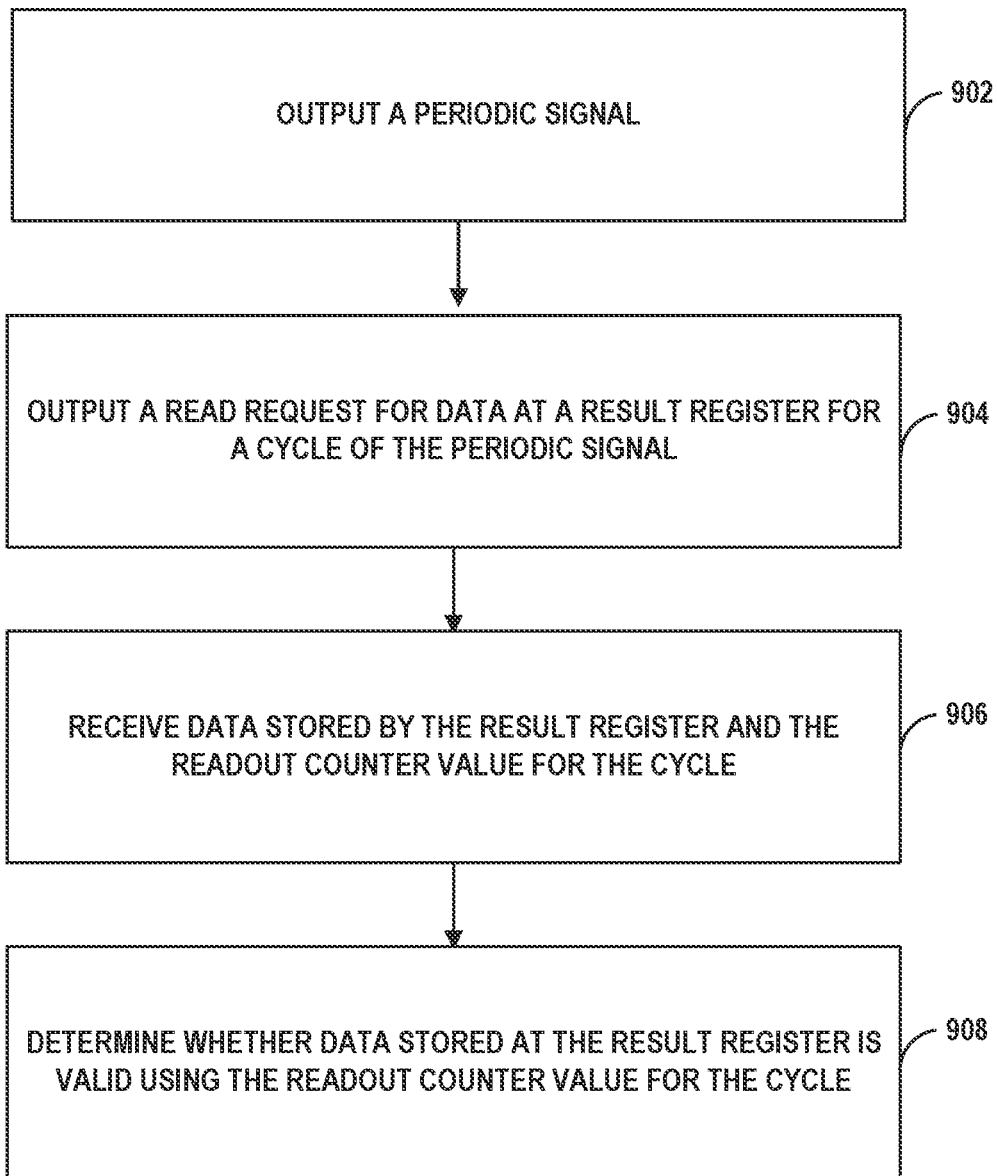
FIG. 9 is a flow diagram for determining whether data stored at a result register is valid using a readout counter value, in accordance with this disclosure.

FIG. 9 is a flow diagram for determining whether data stored at a result register is valid using a readout counter value, in accordance with this disclosure. FIG. 9 is discussed from the perspective of the circuit shown in FIG. 4 for example purposes only, although other devices or circuits could perform the techniques of FIG. 9.

A device, such as, for example, controller circuit 401, may output a periodic signal (902). In some examples, the periodic signal may be a PWM signal. For instance, circuit 404 may be configured to drive switching circuitry (e.g., an inverter) using the PWM signal. However, in other examples, the periodic signal may be different.

Controller circuit 401 may output a read request for data at result register 412 for a cycle of the periodic signal (904). For example, controller circuit 401 may generate and output read requests 508A-508F (e.g., using a serial bus). Controller circuit 401 may receive data stored by result register 412 and readout counter value 414 for the cycle (906) and determine whether data stored at the result register is valid using the readout counter value for the cycle (908).

For example, controller circuit 401 may determine that the data stored at result register 412 is valid in response to the readout counter value for the cycle being modified by the gate driver once from the predetermined value. For instance, controller circuit 401 may determine that conversion result 504B is valid in response to readout counter value 506 for the cycle is modified by circuit 404 once from the predetermined value (e.g., the readout counter value for the cycle is 1). In this instance, circuit 404 may modify the readout counter value 506 by incrementing readout counter value 506 from 0 to 1, where the predetermined value is 0.

Controller circuit 401 may determine that the data stored at result register 412 has been previously output to controller circuit 401 in response to readout counter value 414 for the cycle matching the predetermined value. For example, controller circuit 401 may determine that conversion result 504C output in response to read request 508D has been previously output to controller circuit 401 in response to readout counter value 506 for the cycle N+2 being equal to zero.

Controller circuit 401 may determine that data at result register 412 has not been read for at least one cycle of the periodic signal in response to readout counter value 414 for the cycle being modified by the circuit 404 more than once from the predetermined value. For example, controller circuit 401 may determine that conversion result 504D was not read in response to readout counter value 506 for cycle N+4 being equal to 2. In some examples, controller circuit 401 may interpolate data for the one or more missing conversion results.

The following clauses may illustrate one or more aspects of the disclosure.

Clause A1. A gate driver circuit comprising: one or more datastores configured to store one or more result registers; timer circuitry configured to generate a timing signal; and logic circuitry coupled to the one or more datastores and configured to: drive switching circuitry using a switching signal; determine a triggering point of a first cycle of a plurality of cycles of the switching signal; in response to the determination of the triggering point, control, using the switching signal, one or more ADCs to store a first data sample at the one or more result registers; and in response to a determination that a set of one or more cycles of the plurality of cycles of the switching signal does not include a triggering point, control, using the timing signal, the one or more ADCs to store a second data sample at the one or more result registers.

Clause A2. The gate driver of clause A1, wherein to control the one or more ADCs using the switching signal, the logic circuitry is configured to cause the one or more ADCs to generate the first data sample at a first triggering time that corresponds to the triggering point of the switching signal.

Clause A3. The gate driver of clauses A1-A2, wherein to determine the triggering point of the switching signal, the logic circuitry is configured to determine a first transition from an off state to an on state of the first cycle of the plurality of cycles of the switching signal and add a first time delay; or wherein to determine the triggering point of the switching signal, the logic circuitry is configured to determine a second transition from the on state to the off state of the first cycle of the plurality of cycles of the switching signal and add a second time delay.

Clause A4. The gate driver of clauses A1-A3, wherein to control the one or more ADCs using the timing signal, the logic circuitry is configured to: determine a triggering point of the timing signal; and cause the one or more ADCs to generate the second data sample at a second triggering time that corresponds to the triggering point of the timing signal.

Clause A5. The gate driver of clause A4, wherein to generate the timing signal, the timer circuitry is configured to indicate the triggering point of the timing signal when a predetermined amount of time has elapsed since a counter of the timer circuitry was initiated.

Clause A6. The gate driver of clauses A1-A5, wherein the logic circuitry is further configured to output the first data sample and the second data sample.

Clause A7. The gate driver of clause A6, wherein the logic circuitry is further configured to receive the switching signal from a controller circuit; and wherein the logic circuitry is configured to output the first data sample and the second data sample to the controller circuit.

Clause A8. The gate driver of clause A7, wherein the switching signal is generated by the controller circuitry based on the first data sample and the second data sample.

Clause A9. The gate driver of clauses A1-A8, wherein the logic circuitry is further configured to: cause the one or more ADCs to generate the first data sample using a measurement of one or more of a supply voltage output by the switching circuitry, a voltage at a switching element of the switching circuitry, a voltage output by a supply configured to power the gate driver circuit, or a temperature; and cause the one or more ADCs to generate the second data sample using a second measurement of one or more of the supply voltage output by the switching circuitry, the voltage output by the supply configured to power the gate driver circuit, or the temperature.

Clause A10. The gate driver of clauses A1-A9, wherein the switching circuitry comprises an inverter; and wherein the switching signal comprises a PWM signal.

Clause A11. The device of clauses A1-A10, wherein the logic circuitry is further configured to generate a first value indicating that the first data sample is generated when the logic circuitry controlled the one or more ADCs using the switching signal and to store the first value at the one or more result registers; and wherein the logic circuitry is further configured to generate a second value indicating that the second data sample is generated when the logic circuitry controlled the one or more ADCs using the timing signal and to store the second value at the one or more result registers.

Clause A12. The gate driver of clauses A1-A11, wherein to generate the first data sample, the logic circuitry is further configured generate a first value indicating whether the switching signal indicated only one switching state while the one or more ADCs sampled the first sample data, wherein the switching state comprises an on state or an off state; and wherein to generate the second data sample, the logic circuitry is further configured to generate a second value indicating whether the switching signal indicated only one switching state while the one or more ADCs sampled the second sample data.

Clause A13. The gate driver of clauses A1-A12, wherein the logic circuitry comprises: detector circuitry configured to generate a first triggering signal using the switching signal; inactivity circuitry configured to generate a second triggering signal using the timing signal; and trigger circuitry configured to cause the one or more ADCs to sample data for one or more parameters in response to each respective first triggering point of the first triggering signal and each respective second triggering point of the second triggering signal.

Clause A14. The gate driver of clause A13, wherein the logic circuitry further comprises switching state detection circuitry configured to generate a value indicating whether the switching signal indicated only one switching state while the trigger circuitry causes the one or more ADCs to sample data for the one or more parameters.

Clause A15. A method comprising: driving switching circuitry using a switching signal; determining a triggering point of a first cycle of a plurality of cycles of the switching signal; in response to determining the triggering point, controlling, using the switching signal, one or more ADCs to store a first data sample at one or more result registers of one or more datastores; and in response to determining that a set of one or more cycles of the plurality of cycles of the switching signal does not include a triggering point, controlling, using the timing signal, the one or more ADCs to store a second data sample at the one or more result registers.

Clause A16. The method of clause A15, wherein controlling the one or more ADCs using the switching signal comprises causing the one or more ADCs to generate the first data sample at a first triggering time that corresponds to the triggering point of the switching signal.

Clause A17. The method of clause A15-16, wherein controlling the one or more ADCs using the timing signal comprises: determining a triggering point of the timing signal; and causing the one or more ADCs to generate the second data sample at a second triggering time that corresponds to the triggering point of the timing signal.

Clause A18. A system comprising: one or more analog-to-digital converters (ADCs); and a gate driver circuit comprising: one or more datastores configured to store one or more result registers; timer circuitry configured to generate a timing signal; and logic circuitry coupled to the one or more datastores and configured to: drive switching circuitry using a switching signal; determine a triggering point of a first cycle of a plurality of cycles of the switching signal; in response to the determination of the triggering point, control, using the switching signal, the one or more ADCs to store a first data sample at the one or more result registers; and in response to a determination that a set of one or more cycles of the plurality of cycles of the switching signal does not include a triggering point, control, using the timing signal, the one or more ADCs to store a second data sample at the one or more result registers.

Clause A19. The system of clause A18, further comprising: a controller circuit, wherein the logic circuitry is further configured to receive the switching signal from the controller circuit; and wherein to output the first data sample and the second data sample, the logic circuitry is configured to output the first data sample and the second data sample to the controller circuit.

Clause A20. The system of clause A19, wherein the controller circuitry is configured to generate the switching signal based on the first data sample and the second data sample.

Clause B1. A circuit comprising: one or more datastores configured to store a result register and a readout counter value; and logic circuitry coupled to the one or more datastores and configured to: cause, for a cycle of a plurality of cycles of a periodic signal, one or more ADCs to store data to the result register; modify the readout counter value in response to the one or more ADCs storing the data to the result register for the cycle; and in response to a read request for the data at the result register for the cycle, output the data stored by the result register, output the readout counter value for the cycle, and, after the output of the readout counter value, set the readout counter value to a predetermined value.

Clause B2. The circuit of clause B1, wherein the predetermined value is zero.

Clause B3. The circuit of any of clauses B1-B2, wherein to modify the readout counter value for the cycle, the logic circuitry is configured to increment the readout counter value.

Clause B4. The circuit of any of clauses B1-B3, wherein the cycle is a current cycle that occurs immediately after a previous cycle in the plurality of cycles of the periodic signal and the read request is a current read request and wherein the logic circuitry is further configured to, prior to the one or more ADCs storing the data to the result register for the current cycle: modify the readout counter value in response to the one or more ADCs storing the data to the result register for the previous cycle; and in response to a read request for the data at the result register for the previous cycle, set the readout counter value to the predetermined value.

Clause B5. The circuit of clause B4, wherein to modify the readout counter value, the logic circuitry is configured to increment the readout counter value; and wherein, to set the readout counter value, the logic circuitry is configured to set the readout counter value to 0.

Clause B6. The circuit of any of clauses B1-B3, wherein the read request is a current read request and wherein the logic circuitry is further configured to: receive, during the cycle, a subsequent read request for the data at the result register for the cycle; and in response to the subsequent read request for the data at the result register for the previous cycle, output the readout counter value for the cycle that is set to the predetermined value.

Clause B7. The circuit of clause B6, wherein the logic circuitry is further configured to, in response to the subsequent read request for the data at the result register for the cycle, output the data at the result register for the cycle.

Clause B8. The circuit of any of clauses B1-B3, wherein the cycle is a first cycle that occurs immediately before a second cycle in the plurality of cycles of the periodic signal, and the second cycle occurs immediately before a third cycle in the plurality of cycles of the periodic signal and the read request is a first read request and wherein the logic circuitry is further configured to: modify the readout counter value from the predetermined value to a first modified value in response to the one or more ADCs storing the data to the result register for the second cycle; modify the readout counter value from the first modified value to a second modified value in response to the one or more ADCs storing the data to the result register for the third cycle; and receive, during the third current cycle, a second read request for the data at the result register; and in response to the second read request for the data at the result register for the third cycle, output the data stored by the result register for the third cycle, output the readout counter value for the third cycle that indicates the second modified value, and, after the output of the readout counter value, set the readout counter value to the predetermined value.

Clause B9. The circuit of clause B8, wherein, to modify the readout counter value from the predetermined value to the first modified value, the logic circuitry is configured to increment the readout counter value from 0 to 1; and wherein, to modify the readout counter value from the second modified value to the third modified value, the logic circuitry is configured to increment the readout counter value from 1 to 2.

Clause B10. The circuit of any of clauses B1-B9, wherein the logic circuitry is configured to output the data stored by the result register and the readout counter value on a serial bus to a controller circuit.

Clause B11. The circuit of clause B10, wherein the logic circuitry is configured to receive the periodic signal from the controller circuit.

Clause B12. The circuit of any of clauses B1-B11, wherein to cause the one or more ADCs to store the data to the result register, the logic circuitry is configured to determine a first transition of the periodic signal from an off state to an on state and add a first time delay; or wherein to cause the one or more ADCs to store the data to the result register, the logic circuitry is configured to determine a second transition of the periodic signal from the on state to the off state and add a second time delay.

Clause B13. The circuit of clauses B1-B12, wherein the periodic signal comprises a PWM signal; and wherein the logic circuitry is further configured to drive, using the PWM signal, an inverter.

Clause B14. A method comprising: causing, for a cycle of a plurality of cycles of a periodic signal, one or more ADCs to store data to a result register; modifying the readout counter value in response to the one or more ADCs storing the data to the result register for the cycle; and in response to a read request for the data at the result register for the cycle, outputting the data stored by the result register, outputting the readout counter value for the cycle, and, after the output of the readout counter value, set the readout counter value to a predetermined value.

Clause B15. A system comprising: a controller circuit configured to output a periodic signal; and a driver circuit comprising one or more datastores configured to store a result register and a readout counter value and comprising logic circuitry coupled to the one or more datastores, the logic circuitry being configured to: cause, for a cycle of a plurality of cycles of the periodic signal, one or more analog-to-digital converters (ADCs) to store data to the result register; modify the readout counter value in response to the one or more ADCs storing the data to the result register for the cycle; and in response to a read request for the data at the result register for the cycle, output the data stored by the result register, output the readout counter value for the cycle, and, after the output of the readout counter value, set the readout counter value to a predetermined value.

Clause B16. The system of clause B15, wherein the controller circuit is further configured to determine that the data stored at the result register is valid in response to the readout counter value for the cycle being modified by the driver circuit once from the predetermined value.

Clause B17. The system of any of clauses B15-B16, wherein, to modify the readout counter value, the driver circuit is configured to increment the readout counter value from 0 to 1; and wherein, to set the readout counter value, the driver circuit is configured to set the readout counter value to 0.

Clause B18. The system of clause B15, wherein the controller circuit is further configured to determine that the data stored at the result register has been previously output to the controller circuit in response to the readout counter value for the cycle matching the predetermined value.

Clause B19. The system of clause B15, wherein the controller circuit is further configured to determine that data at the result register has not been read for at least one cycle of the plurality of cycles of the periodic signal in response to the readout counter value for the cycle being modified by the driver circuit more than once from the predetermined value Clause B20. The system of clause B15 or B19, wherein to modify the readout counter value in response to the one or more ADCs storing the data to the result register for the cycle, the logic circuitry is configured to increment the readout counter value from 1 to 2; and wherein to set the readout counter value, the logic circuitry is configured to set the readout counter value to 0.

In one or more examples, the functions being performed described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this way, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various aspects have been described in this disclosure. These and other aspects are within the scope of the following claims.

What is claimed is:

1. A gate driver circuit comprising:
one or more datastores configured to store one or more result registers;
timer circuitry configured to generate a timing signal; and
logic circuitry coupled to the one or more datastores and configured to:
drive switching circuitry using a switching signal;
determine a triggering point of a first cycle of a plurality of cycles of the switching signal;
in response to the determination of the triggering point, control, using the switching signal, one or more analog-to-digital converters (ADCs) to store a first data sample at the one or more result registers; and
in response to a determination that a set of one or more cycles of the plurality of cycles of the switching signal does not include a triggering point, control, using the timing signal, the one or more ADCs to store a second data sample at the one or more result registers.

2. The gate driver circuit of claim 1, wherein to control the one or more ADCs using the switching signal, the logic circuitry is configured to cause the one or more ADCs to generate the first data sample at a first triggering time that corresponds to the triggering point of the switching signal.

3. The gate driver circuit of claim 1,
wherein to determine the triggering point of the switching signal, the logic circuitry is configured to determine a first transition from an off state to an on state of the first cycle of the plurality of cycles of the switching signal and add a first time delay; or
wherein to determine the triggering point of the switching signal, the logic circuitry is configured to determine a second transition from the on state to the off state of the first cycle of the plurality of cycles of the switching signal and add a second time delay.

4. The gate driver circuit of claim 1, wherein to control the one or more ADCs using the timing signal, the logic circuitry is configured to:
determine a triggering point of the timing signal; and
cause the one or more ADCs to generate the second data sample at a second triggering time that corresponds to the triggering point of the timing signal.

5. The gate driver circuit of claim 4, wherein to generate the timing signal, the timer circuitry is configured to indicate the triggering point of the timing signal when a predetermined amount of time has elapsed since a counter of the timer circuitry was initiated.

6. The gate driver circuit of claim 1, wherein the logic circuitry is further configured to output the first data sample and the second data sample.

7. The gate driver circuit of claim 6,
wherein the logic circuitry is further configured to receive the switching signal from a controller circuit; and
wherein the logic circuitry is configured to output the first data sample and the second data sample to the controller circuit.

8. The gate driver of claim 7, wherein the switching signal is generated by the controller circuitry based on the first data sample and the second data sample.

9. The gate driver circuit of claim 1, wherein the logic circuitry is further configured to:
cause the one or more ADCs to generate the first data sample using a measurement of one or more of a supply voltage output by the switching circuitry, a voltage at a switching element of the switching circuitry, a voltage output by a supply configured to power the gate driver circuit, or a temperature; and
cause the one or more ADCs to generate the second data sample using a second measurement of one or more of the supply voltage output by the switching circuitry, the voltage output by the supply configured to power the gate driver circuit, or the temperature.

10. The gate driver circuit of claim 1,
wherein the switching circuitry comprises an inverter; and
wherein the switching signal comprises a pulse width modulated (PWM) signal.

11. The gate driver circuit of claim 1,
wherein the logic circuitry is further configured to generate a first value indicating that the first data sample is generated when the logic circuitry controlled the one or more ADCs using the switching signal and to store the first value at the one or more result registers; and wherein the logic circuitry is further configured to generate a second value indicating that the second data sample is generated when the logic circuitry controlled the one or more ADCs using the timing signal and to store the second value at the one or more result registers.

12. The gate driver circuit of claim 1,
wherein to generate the first data sample, the logic circuitry is further configured generate a first value indicating whether the switching signal indicated only one switching state while the one or more ADCs sampled the first sample data, wherein the switching state comprises an on state or an off state; and
wherein to generate the second data sample, the logic circuitry is further configured to generate a second value indicating whether the switching signal indicated only one switching state while the one or more ADCs sampled the second sample data.

13. The gate driver circuit of claim 1, wherein the logic circuitry comprises:
detector circuitry configured to generate a first triggering signal using the switching signal;
inactivity circuitry configured to generate a second triggering signal using the timing signal; and
trigger circuitry configured to cause the one or more ADCs to sample data for one or more parameters in response to each respective first triggering point of the first triggering signal and each respective second triggering point of the second triggering signal.

14. The gate driver circuit of claim 13, wherein the logic circuitry further comprises switching state detection circuitry configured to generate a value indicating whether the switching signal indicated only one switching state while the trigger circuitry causes the one or more ADCs to the sample data for the one or more parameters.

15. A method comprising:
driving switching circuitry using a switching signal;
determining a triggering point of a first cycle of a plurality of cycles of the switching signal;
in response to determining the triggering point, controlling, using the switching signal, one or more analog-to-digital converters (ADCs) to store a first data sample at one or more result registers of one or more datastores; and
in response to determining that a set of one or more cycles of the plurality of cycles of the switching signal does not include a triggering point, controlling, using the timing signal, the one or more ADCs to store a second data sample at the one or more result registers.

16. The method of claim 15, wherein controlling the one or more ADCs using the switching signal comprises causing the one or more ADCs to generate the first data sample at a first triggering time that corresponds to the triggering point of the switching signal.

17. The method of claim 15, wherein controlling the one or more ADCs using the timing signal comprises:
determining a triggering point of the timing signal; and
causing the one or more ADCs to generate the second data sample at a second triggering time that corresponds to the triggering point of the timing signal.

18. A system comprising:
one or more analog-to-digital converters (ADCs); and
a gate driver circuit comprising:
one or more datastores configured to store one or more result registers;
timer circuitry configured to generate a timing signal; and
logic circuitry coupled to the one or more datastores and configured to:
drive switching circuitry using a switching signal;
determine a triggering point of a first cycle of a plurality of cycles of the switching signal;
in response to the determination of the triggering point, control, using the switching signal, the one or more ADCs to store a first data sample at the one or more result registers; and
in response to a determination that a set of one or more cycles of the plurality of cycles of the switching signal does not include a triggering point, control, using the timing signal, the one or more ADCs to store a second data sample at the one or more result registers.

19. The system of claim 18, further comprising:
a controller circuit,
wherein the logic circuitry is further configured to receive the switching signal from the controller circuit; and
wherein to output the first data sample and the second data sample, the logic circuitry is configured to output the first data sample and the second data sample to the controller circuit.

20. The system of claim 19, wherein the controller circuitry is configured to generate the switching signal based on the first data sample and the second data sample.

* * * * *